United States Patent [19]

Engen

[11] 4,104,583
[45] Aug. 1, 1978

[54] SIX-PORT MEASURING CIRCUIT

[75] Inventor: Glenn F. Engen, Boulder, Colo.

[73] Assignee: The United States of America as represented by the Secretary of Commerce, Washington, D.C.

[21] Appl. No.: 829,381

[22] Filed: Aug. 31, 1977

[51] Int. Cl.$^2$ ............................................ G01R 27/04
[52] U.S. Cl. .............................. 324/58 A; 324/58 R; 324/95
[58] Field of Search ................... 324/58 A, 58 R, 95

[56] References Cited

U.S. PATENT DOCUMENTS

| 3,517,309 | 6/1970 | Gerst | 324/95 X |
| 3,522,526 | 8/1970 | Sanderson | 324/58 A |

FOREIGN PATENT DOCUMENTS

| 1,020,696 | 12/1957 | Fed. Rep. of Germany | 324/58 R |
| 854,878 | 11/1960 | United Kingdom | 324/58 R |
| 889,899 | 2/1962 | United Kingdom | 324/58 R |
| 277,029 | 11/1971 | U.S.S.R. | 324/58 R |

Primary Examiner—Stanley T. Krawczewicz

Attorney, Agent, or Firm—Eugene J. Pawlikowski; Alvin J. Englert

[57] ABSTRACT

A six-port measuring circuit includes only four hybrids coupling two input ports to four power measuring ports. A first hybrid is connected to one input port and to second and third hybrids; a second input port is connected to the second hybrid; the second and third hybrids are connected to a fourth hybrid; first and second measuring ports are connected respectively to the second and third hybrids; and third and fourth measuring ports are connected to the fourth hybrid. In one embodiment, the first hybrid is a 180° hybrid; and the second, third and fourth hybrids are quadrature hybrids. In a second embodiment, the first three hybrids are 180° hybrids and the fourth a quadrature hybrid. Another embodiment includes three quadrature hybrids as the first three hybrids and a 180° hybrid as the fourth hybrid. A fourth embodiment employs four quadrature hybrids. The basic six-port circuit is useful as a vector voltmeter and may be coupled to a transmission line by means of a directional coupler. Net power and the complex reflection coefficient $\Gamma_l$ may be computed from the power readings at the measuring ports.

21 Claims, 15 Drawing Figures

DIRECTIONAL COUPLER

MEASUREMENT PORT

DIRECTIONAL COUPLER

MEASUREMENT PORT

SIX-PORT MEASURING CIRCUIT

BACKGROUND OF THE INVENTION

1. Field of the Invention

This invention relates to measuring systems and more particularly to measuring systems employing six-port measuring circuits.

2. Description of the Prior Art

The so-called "six-port" approach to the measurement of microwave parameters, such as power and complex impedance, provides an attractive alternative to existing automated measurement schemes, because the requirement for frequency conversion is eliminated. Typical prior art disclosures of the six-port approach are found in a number of references, including:

G. F. Engen and C. A. Hoer, "Application of an Arbitrary 6-Port Junction to Power Measurement Problems," *IEEE Trans. Instrum. Meas.*, Vol. IM-21, pp. 470–474, Nov. 1972;

C. A. Hoer and G. F. Engen, "Analysis of a Six-Port Junction for Measuring $v$, $i$, $a$, $b$, $z$, $\Gamma$, and Phase," presented at the Proc. IMEKO Symp. Acquisition and Processing of Measurement Data for Automation, Dresden, Germany, June 17–23, 1973;

G. F. Engen, "Calibration of an Arbitrary Six-Port Junction for Measurement of Active and Passive Circuit Parameters," *IEEE Trans. Instrum. Meas.*, Vol. IM-22, pp. 295–299, December 1973;

C. A. Hoer, "Using Six-Port and Eight-Port Junctions to Measure Active and Passive Circuit Parameters," Nat. Bur. Stand. (U.S.), Tech. Note 673, 23 pages, September 1975;

C. A. Hoer and K. C. Roe, "Using an Arbitrary Six-Port Junction to Measure Complex Voltage Ratios," *IEEE Trans. Microwave Theory & Techniques*, Vol. MTT-23, No. 12, pp. 978–984, December 1975;

E. L. Komarek, "An Automated Broadband System for Measurement of One-Port Microwave Parameters," Conference on Precision Electromagnetic Measurements, June 1976, Boulder, Colo., *CPEM Digest*, pp. 167–170;

G. F. Engen, "Determination of Microwave Phase and Amplitude from Power Measurements," *IEEE Trans. Instrum. Meas.*, Vol. IM-25, No. 4, pp. 414–418, December 1976; and S. B. Cohn and N. P. Weinhouse, "An Automatic Microwave Phase Measurement System," *The Microwave Journal*, pp. 49–56, February 1964.

Moreover, preliminary results, in the case of power at least, suggest that the requirement for a phase-locked source is eliminated as well as disclosed in the Komarek reference.

As noted (or stressed) in these prior art disclosures, the theory which has been developed applies to a five- or six-port junction of arbitrary parameters. In its present form, however, the theory provides only a limited amount of insight into the question of choosing the design goals for the five-or six-port so as to best exploit the technique. In some of the prior work, the six-port was considered an extension of the reflectometer concept. This led to six-port designs which are now considered obsolete. In other cases, guidelines, which were inferred from an incomplete analysis, have been proven to be partially in error.

SUMMARY OF THE INVENTION

It is the object of the invention to provide a circuit which permits optimum implementation of the six-port concept for the measurement of net power and the complex reflection coefficient ($\Gamma_l$) at a given terminal surface in a uniform transmission line, from which other terminal variables, such as wave amplitudes, voltage, current, impedance and the like, may be obtained by the use of well known formulas.

It is a further object of the invention to provide a measuring circuit of this character which, moreover, may be implemented over a wide frequency range.

Whereas the circuits of the prior art use at least five hybrids, it is an object of the invention to provide a circuit employing no more than four hybrids to achieve the basic response.

Because signal power is very costly, it is another object of the invention to provide a circuit of this character which is substantially lossless and which does not require the dissipation of signal power for effecting the desired measurements.

To these ends, the invention contemplates a six-port measuring circuit comprising only four hybrid means and having first and second input ports and third, fourth, fifth, and sixth measuring ports. The first input port is coupled to a first port of the first hybrid means. The second input port is coupled to a first port of the second hybrid means. A second port of the first hybrid means is coupled to a second port of the second hybrid means. A third port of the first hybrid means is coupled to a first port of the third hybrid means. A third port of the second hybrid means is coupled to a first port of the fourth hybrid means. A second port of the third hybrid means is coupled to a second port of the fourth hybrid means. The third measuring port is coupled to a fourth port of the second hybrid means. The fourth measuring port is coupled to a third port of the third hybrid means. The fifth measuring port is coupled to a third port of the fourth hybrid means, and the sixth measuring port is coupled to a fourth port of the fourth hybrid means. In a first embodiment of the invention, the first hybrid means is a 180° hybrid; and the second, third, and fourth hybrid means are quadrature hybrids. In the second embodiment, the first, second, and third hybrid means are 180° hybrids; and the fourth hybrid means is a quadrature hybrid. In a third embodiment, the first, second and third hybrid means are quadrature hybrids; and the fourth hybrid means is a 180° hybrid. In a fourth embodiment, the first, second, third, and fourth hybrid means are quadrature hybrids.

In each of the embodiments, the six-port network, which is a vector voltmeter, has power responses at each of the measuring ports defined substantially by:

$$P_3 = \tfrac{1}{4} |d|^2 |c/d - j\sqrt{2}/2|^2$$

$$P_4 = \tfrac{1}{4} |d|^2$$

$$P_5 = \tfrac{1}{4} |d|^2 |c/d + (1+j)\sqrt{2}/2|^2$$

$$P_6 = \tfrac{1}{4} |d|^2 |c/d - (1-j)\sqrt{2}/2|^2$$

where $c$ represents the wave amplitude at the second input port, $d$ represents the wave amplitude at the first input port, $P_3$ represents the power response at the third measuring port, $P_4$ represents the power response at the fourth measuring port, $P_5$ represents the power response at the fifth measuring port, and $P_6$ represents the power response at the sixth measuring port.

The input ports of the six-port network may be coupled to a transmission line by a directional coupler having a measurement port at which the emergent and incoming wave amplitudes are designated by $b$ and $a$, respectively, and wherein, for the case of a 6 dB coupler, $$c = a\sqrt{3}/2$$
$$d = b\sqrt{3}.$$

In terms of the measurement port of the directional coupler, the power responses are defined by:

$$P_3 = \tfrac{3}{8}|b|^2|\Gamma_l - j\sqrt{2}|^2$$

$$P_4 = \tfrac{3}{4}|b|^2$$

$$P_5 = 3/16\,|b|^2|\Gamma_l + (1+j)\sqrt{2}|^2$$

$$P_6 = 3/16\,|b|^2|\Gamma_l - (1-j)\sqrt{2}|^2$$

where $\Gamma_l$ is the complex reflection ratio between the amplitudes of the incoming wave $a$ and the energing wave $b$.

From the power measurements $P_3$, $P_4$, $P_5$, and $P_6$ at the measuring ports of the six-port, one can compute, for circuits closely approximating the ideal, the net power and the complex reflection coefficient, $\Gamma_l$, as follows:

Net power = $4/3\,[4\,P_4 - P_3 - P_5 - P_6]$ and $$\Gamma_l = \frac{\sqrt{2}\;[(P_5 - P_6) + j\,(P_5 + P_6 - P_3 - P_4)/2]}{2\,P_4}.$$

These and other objects, features and advantages of the invention will become more readily apparent from consideration of the following detailed description of the invention when taken in conjunction with the drawings.

DETAILED DESCRIPTION

Figure 1:
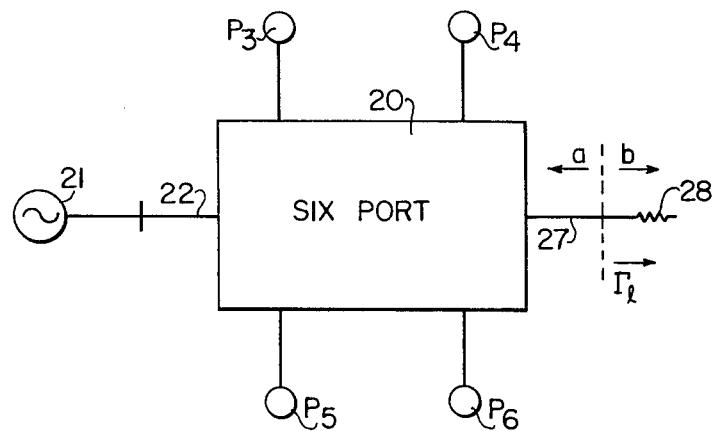
FIG. 1 is a schematic diagram of a six-port network.

To begin with, the theoretical development of the invention will be considered. The measurement problem is illustrated in FIG. 1. The six-port network 20 is energized from a generator 21 through a first input port 22 and is coupled through a second input port 27 at a terminal plane (indicated by the dash line) to a transmission line represented by a load 28. The six-port has four measuring ports connected, respectively, to power meters $P_3$, $P_4$, $P_5$, and $P_6$. At the terminal plane, there are three independent parameters, some or all of which may be required in a given measurement. Although these may be expressed in a variety of ways, a convenient set is the magnitude of the emerging wave amplitude $|b|$ and the complex ratio $\Gamma_l$ between the amplitudes of the incoming wave $a$ and the emerging wave $b$.

Following the arguments outlined in the aforementioned article by applicant in *IEEE Trans. Instrum. Meas.*, Vol. IM-22, pp. 295–299, December 1973, one can write the equations for the observed power meter readings $P_3$, $P_4$, $P_5$, and $P_6$:

$$P_3 = |Aa + Bb|^2 \tag{1}$$

$$P_4 = |Ca + Db|^2 \tag{2}$$

$$P_5 = |Ea + Fb|^2 \tag{3}$$

$$P_6 = |Ga + Hb|^2. \tag{4}$$

Here A, B, C, D, E, F, G, and H are complex constants whose values are determined by the design of the six-port and which are assumed to be known and may be prescribed at will. It is the preliminary objective of this analysis to develop criteria for choosing the values A, B, C, D, E, F, G, and H in a way which leads to an optimal design.

Apart from the criteria which may emerge from a study of these equations, there are the additional practical requirements of correcting for power instability in the signal source and assuring that the power levels at the several detectors and output port are maintained at some optimum value as the frequency is varied. Ordinarily, this calls for a feedback loop and, unless otherwise provided for, an additional directional coupler or other means to sample and measure the incident wave amplitude, $|b|$. The measurement of $|b|$, however, represents a determination of one of the measurands of interest; thus, there is a double role served by designing the six-port in such a way that the response of one of the power meters is proportional to $|b|^2$. The fourth measuring port connected to power meter $P_4$ is chosen for this role. Referring to Equation (2), the first design objective is that $C = 0$, and to the extent that this condition is realized, Equation (2) becomes $$P_4 = |D|^2\,|b|^2 \tag{5}$$

In order to explicitly display the measurands of interest, Equations (1), (3), and (4) may be written $$P_3 = |A|^2|b|^2\,|\Gamma_l - q_3|^2 \tag{6}$$

$$P_5 = |E|^2|b|^2\,|\Gamma_l - q_5|^2 \tag{7}$$

$$P_6 = |G|^2|b|^2\,|\Gamma_l - q_6|^2 \tag{8}$$

where $q_3 = -B/A$, $q_5 = -F/E$, and $q_6 = -H/G$.

The parameters $|b|$ and $\Gamma_l$ may be considered as representing a point in three-dimensional space, permitting the problem to be discussed in terms of three-dimensional geometry. A more convenient approach, however, is to first eliminate $|b|^2$ from Equations (6), (7), and (8) by means of Equation (5). This leads to a problem in two dimensions. Although Equation (5) is only an approximation, it is convenient initially to treat it as exact and then consider the general case.

Elimination of $|b|^2$ between Equations (5) and (6), for example, leads to $$|\Gamma_l - q_3|^2 = |D/A|^2 \cdot P_3/P_4. \qquad (9)$$

Figure 2:
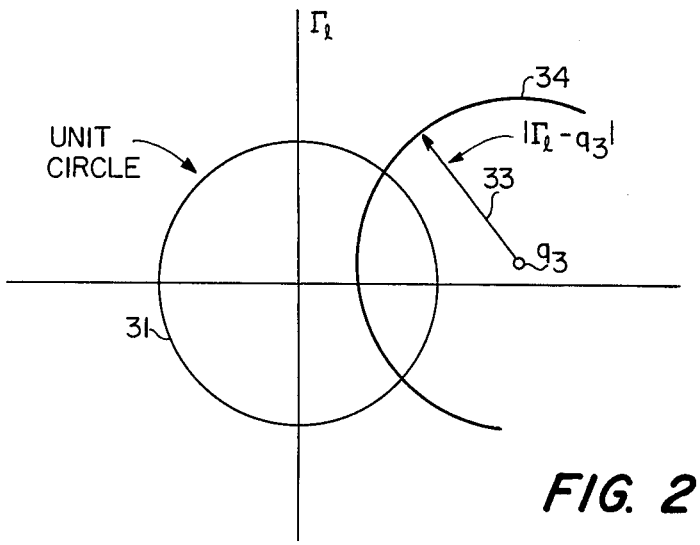
FIGS. 2–5 are schematic diagrams illustrating the theoretical development of the invention.

FIG. 2 represents the $\Gamma_l$ plane. Ordinarily, the terminations to be measured are passive ($|\Gamma_l| \leq 1$) so that $\Gamma_l$ falls within unit circle 31 as shown. For reasons which will emerge, it is convenient to assume initially that $q_3$ lies outside this circle. Given the measurement results $P_3$, $P_4$, and assuming $q_3$ and $|D/A|^2$ are known, the locus of possible values for $\Gamma_l$ is a circle 34 whose center is at $q_3$ and whose radius 33, $|\Gamma_l - q_3|$, may be determined from Equation (9).

Figure 3:
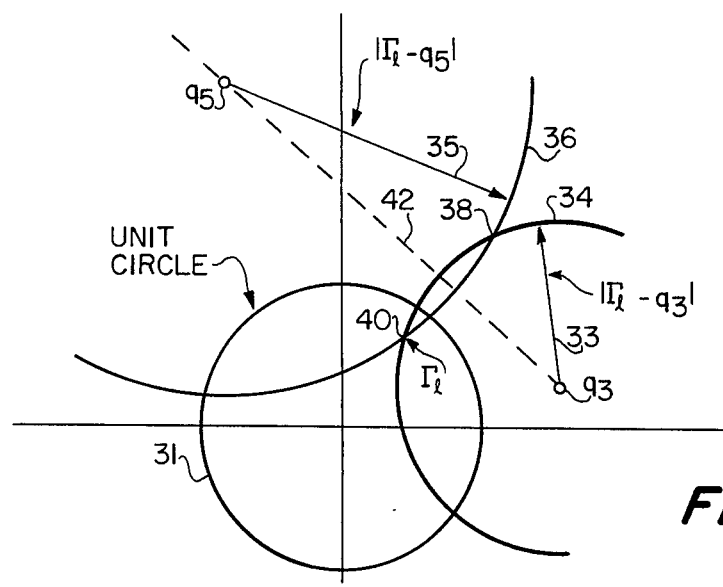

In the same way, Equations (5) and (7) may be combined, and the radius 35 of another circle 36, which contains $\Gamma_l$, whose center is at $q_5$, determined. The situation is now as shown in FIG. 3. Here $\Gamma_l$ is determined by the intersection of the two circles. The two circles, however, intersect in a pair of points 38 and 40. In this example, point 38 falls outside the unit circle. One is therefore able to choose between the two solutions on the basis $|\Gamma_l| \leq 1$: point 40 thus represents the correct solution for $\Gamma_l$.

Thus far, no use has been made of $P_6$, and the system may be considered a five-port rather than as a six-port. Before introducing $P_6$, some additional observations on the five-port mode are of interest. As already noted, the five-port mode leads to a pair of values for $\Gamma_l$. Provided, however, that a straight line 42 between $q_3$ and $q_5$ does not intersect unit circle 31, one is assured that one of these roots will fall outside of unit circle 31 and (assuming a passive termination) may be rejected on this basis.

From further inspection of FIG. 3, one notes that the angle at which the circles intersect is rather small; and it is easily recognized that the position of $\Gamma_l$ in a direction perpendicular to line 42 between $q_3$ and $q_5$, has a high sensitivity to errors in $|\Gamma_l - q_3|$ or $|\Gamma_l - q_5|$. In the parallel direction, the sensitivity is appreciably less. Over the range of possible choices for $\Gamma_l$, and in particular if $\Gamma_l$ moves around the perimeter of unit circle 31, one can expect a considerable variation in these sensitivities or expected errors in a practical measurement system.

At first glance, one might be tempted to relieve this problem by increasing the distance from $q_3$ and $q_5$ to the origin. For example, if $q_3 = 10$ and $q_5 = j10$, the intersection of the respective circles will be nearly orthogonal over the entire unit circle. Unfortunately, however, this superficial improvement is more than offset by other considerations. In the example just given, a little further study would show that a 1% error in measuring $|\Gamma_l - q_3|$ or $|\Gamma_l - q_5|$ would translate respectively into a nominal uncertainty of 0.1 in the real and imaginary parts of $\Gamma_l$.

On the basis of this discussion, it should be apparent that the choice of optimum values for $q_3$ and $q_5$ represents a compromise between a number of conflicting requirements. How one chooses to resolve this conflict will depend in part, for example, upon how much variation in accuracy at the perimeter of the unit circle one is prepared to accept in return for improved accuracy at the center.

Although the five-port measurement concept is technically sound, it will be appreciated that there are substantial benefits from a six-port vs. a five-port approach. Because the improvements obtained from the six-port approach are substantial, the future for the five-port appears limited. For this reason, the question of optimum design for the five-port will not be considered in further detail.

Figure 4:
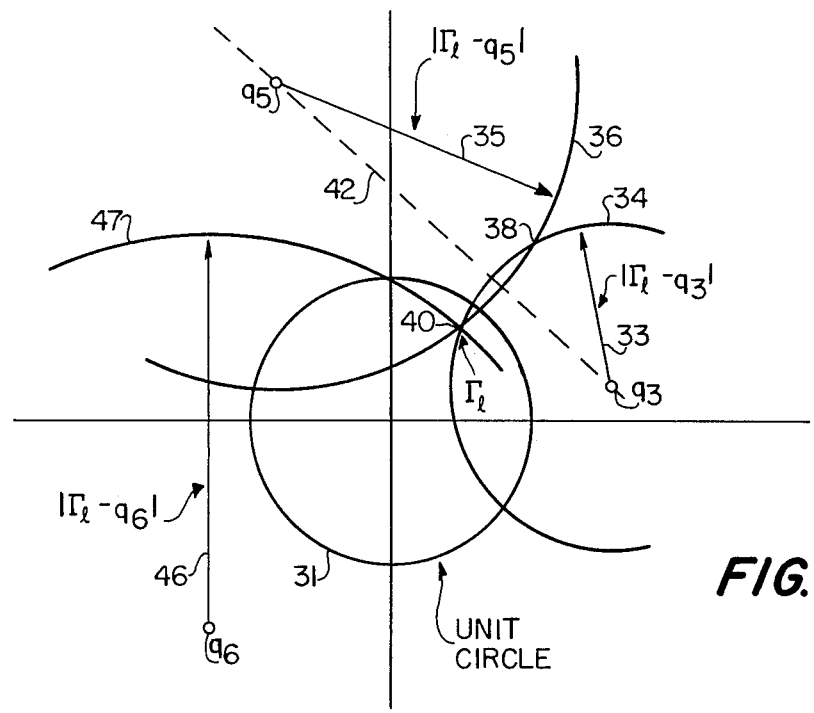

To continue, $q_6$ is chosen as shown in FIG. 4, and $|\Gamma_l - q_6|$ is determined from Equations (8) and (5). This provides a third circle 47 of radius 46 upon which $\Gamma_l$ must lie and which (ideally) must pass through the intersection of the other two circles as shown in FIG. 4. In practice, because of measurement errors, the three circles will not intersect in a point; and some sort of statistical weighting is called for. Although it is not within the scope of this disclosure to consider this aspect in detail, it is intuitively obvious that this additional detector has substantially enhanced the accuracy with which $\Gamma_l$ may be determined. In particular, the position of $\Gamma_l$ in the direction orthogonal to the line 42 between $q_3$ and $q_5$, and which was quite sensitive to errors in $P_3$ and $P_5$, may now be inferred primarily from $|\Gamma_l - q_6|$ and with less sensitivity to error. Moreover, the double root ambiguity has also been resolved; no longer is it required that the line connecting $q_3$ and $q_5$ lie outside the unit circle.

Following this general approach, the system may be expanded to seven or more ports. With the possible exception of a seven-port, however, this does not ordinarily appear to be warranted.

In the discussion thus far, it has been assumed that Equation (5) was satisfied; at best, this is only approximately true. Unfortunately, a complete discussion of the more general case is lengthy, and many of the conclusions will be stated without detailed proof. In order to generalize the approach, it is convenient to ignore $P_4$ and begin by eliminating $|b|^2$ between Equations (6) and (8). This leads to $$\frac{|\Gamma_l - q_3|^2}{|\Gamma_l - q_6|^2} = |G/A|^2 P_3/P_6. \qquad (10)$$

Figure 5:
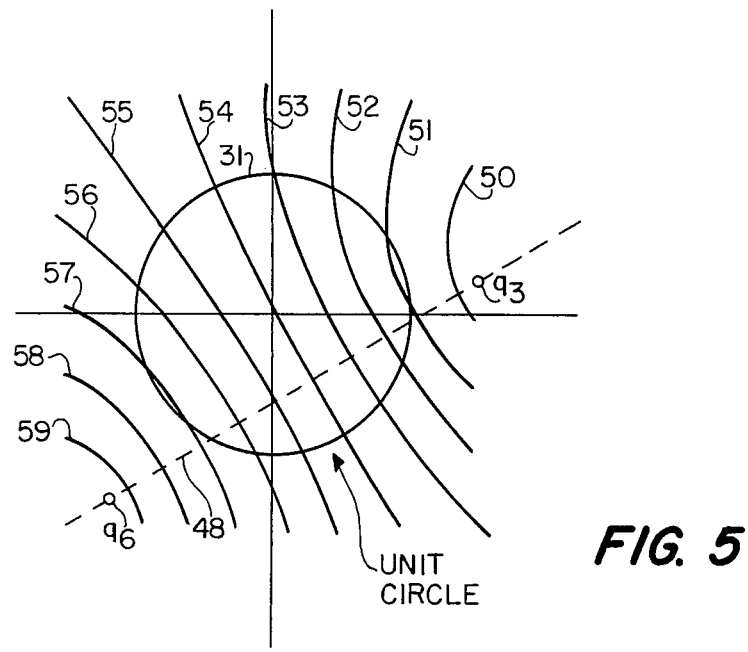

If one expands this result, it can be shown, as illustrated in FIG. 5, that the locus of possible values for $\Gamma_l$ is again a circle, with its center somewhere on the line 48 through $q_3$ and $q_6$. If the ratio $P_3/P_6$ is permitted to take on different values, a family of circles, such as circles 50–59, each corresponding to a different value of $P_3/P_6$, is generated as shown in FIG. 5. It is of interest, and easily shown, that this family of circles is analagous to that used to illustrate the surfaces of constant potential associated with a parallel wire transmission line, where $q_3$ and $q_6$ correspond to the positions of the conductors. As already noted, for a given value of $P_3/P_6$, the locus of $\Gamma_l$ is a circle, but unlike the previously described ideal case, the position of the center, as well as radius, is a function of $P_3/P_6$. In a similar manner, Equations (7) and (8) may be combined, leading to another circle, this time with its center somewhere on the line through $q_5$ and $q_6$. As before, $\Gamma_l$ is determined by the intersection of two circles, and two possible values of $\Gamma$ are obtained. For large values of $|q_6|$, the role played by $P_6$ approaches that previously filled by $P_4$ and becomes identical to it as $|q_6| \to \infty$. Thus, the primary correction to the prior description, which was based on Equation (5) is to recognize that the respective circles are not centered at $q_3$ or $q_5$, although this is usually a good approximation. Finally, one may also combine Equations (6) and (7). This also leads to a circle, this time with its center on the line which connects $q_3$ and $q_5$. It can be shown that this center also lies on the line which connects the centers of the two previously determined circles and passes through their points of intersection. Thus, there is no additional information to be gained by this exercise. Because $P_4$ has been ignored, it will be recognized that this discussion pertains to a five-port. Although not its primary objective, the discussion has also provided insight into possible designs if for some reason levelling is not required. The extension to a six-port follows along the lines already presented.

As noted earlier, and referring again to Equation (2), the first design objective ordinarily is that $C = 0$. This leads to Equation (5). Although nothing has been said, thus far, about the choice of $|D|$, $|A|$, $|E|$, and $|G|$, it is immediately evident from inspection of Equations (5), (6), (7), and (8) that these are scale factors, which for a given signal at the output port, determine the power levels at the several power meters. Ordinarily, these parameters are chosen so that these levels are compatible with the power meter characteristics.

The major design question centers around the choice of $q_3$, $q_5$, and $q_6$. One representative set of values is shown in FIG. 4. However, it is appropriate to ask if a better choice would be to place one of the $q$'s, say $q_3$, at the center of the unit circle. If this is done, one has one response $P_4$ which measures the incident wave $|b|$, while $P_3$ now measures the reflected wave $|a|$. In this case, the six-port incorporates the reflectometer, a device which has played a substantial role in the prior art. There are several considerations, however, which argue against this choice for $q_3$. Assuming one could obtain the condition $q_3 = 0$, the prospect of achieving a direct measure of the reflection coefficient magnitude is indeed attractive. In actual fact, in the current state of the art, even with this as a design goal, the expected deviations of $q_3$ from zero are such as to largely negate potential advantages. A more serious objection arises from dynamic range vs. measurement precision considerations. This point is perhaps best illustrated by a specific example.

In FIG. 4, let $q_3$ be moved to the center of the diagram, and let $q_5 = 2$ and $q_6 = j2$. If bolometric type power meters are assumed, typical performance specifications include: upper power limit — 10 mW., error — 0.1% $\pm 1\mu W$. Next, the value of $|A|$ is chosen so that $P_3 = 10$ mW. (the upper limit) when $|\Gamma_l| = 1$. If now one wishes to measure a termination for which $|\Gamma_l| \sim 0.01$, $P_3$ will be approximately $1\mu W$., and the signal-to-noise ratio has dropped to unity. By contrast if $|E|$ and $|G|$ are porperly chosen, $P_5$ and $P_6$ will be operating at approximately 50% of their maximum expected value ($|\Gamma_l| \leq 1$). Thus, the 0.1% error will be the dominating term in this probable error. Since this applies to power, the voltage error will be half of this. On the other hand, the distance from $q_5$ and $q_6$ is 2, so that the uncertainty with which a point in the neighborhood of the origin is located is $\pm 0.001$, which corresponds to a 10% error when $|\Gamma_l| = 0.01$. This represents a nominal ten-fold improvement in accuracy. The interesting and unexpected conclusion is that, if one requires operation over the entire range $|\Gamma| \leq 1$, a point in the neighborhood of the orgin can be located more precisely in terms of its distances from points which are somewhat removed, than from a point in its immediate neighborhood. Returning to the example just given, the response of $P_3$ is virtually useless in inferring the value of $\Gamma_l$ when $|\Gamma_l|$ is small; it appears that a better choice of $q_3$ would be as shown in FIG. 4. Although the foregoing arguments do not necessarily hold for all choices of power meters, they do appear valid for the immediate candidates which include the bolometric and diode types.

Having disposed of the question of placing one of the $q$'s at the center of the unit circle, it now appears, from considerations of symmetry, that $q_3$, $q_5$, and $q_6$ should be located at the vertices of an equilateral triangle whose center is at the origin. If one accepts this proposition, this calls for $|q_6| = |q_5| = |q_3|$, while the arguments differ by $\pm 120°$. Thus, the only remaining choice is the value of $|q_3|$.

Before addressing this question, several additional practical considerations should be noted. One of these concerns the power requirement at the input to the six-port. To the extend that this can be minimized, the power output requirements on the signal source may be reduced. This calls for a design where all of the input power is ultimately delivered to the several detectors rather than being dissipated in other internal terminations. A further consideration pertains to the ratio of the signal amplitudes which appear at the detectors as contrasted with that at the measurement port. For example, if one is interested in calibrating bolometer mounts, and one is also using bolometric detectors for $P_3$—$P_6$, the range of signal levels at the different ports, including the measuring port, are nominally equal. Finally, although calibration procedures will not be considered here, one of the more promising techniques, which is based on sliding shorts and loads, is better conditioned for certain choices of $|q_3|$ than others.

To return to the problem of choosing $|q_3|$, an earlier paragraph has commented on the errors which result from making this too large. Although the use of four detectors has eliminated the ambiguity problem, and thus permits one to choose $|q_3| < 1$, there are easily recognized similar problems if $|q_3|$ becomes too small. In particular, since $\Gamma_l$ is determined from its distances from $q_3$, $q_5$, and $q_6$, it is evident that an ill-conditioned situation will result if these distances become large in comparison with the distances between $q_3$ and $q_5$, $q_3$ and $q_6$, or $q_5$ and $q_6$. On the basis of these last considerations, it appears that an optimum value for $|q_3|$ might be expected to lie in the range 0.5 - 1.5. However, the calibration techniques referred to earlier become poorly conditioned if $|q_3| \simeq 1$. Moreover, an experimental study with the aid of a computer shows a decrease in the measurement accuracy when $|\Gamma_l| \simeq |q_3|$. Since there is usually a substantial interest in values of $\Gamma_l$ with nominal magnitude of unity, there is a double reason for avoiding $|q_3| \simeq 1$. Apart from values close to unity, the other region of primary interest is $|\Gamma_l| \leq 0.3$. In order to provide the largest possible band-width, a fairly loose tolerance on the performance of the individual components from which the six-port is constructed is desirable. This now reduces the choices for $|q_3|$ to values in the neighborhood of 0.5 or 1.5. As will be shown in what follows, the former generally calls for a larger power input to the six-port, and where this is a potential problem, one is left with 1.5 as the design objective for $|q_3|$.

These principles are incorporated in the six-port measuring circuit of the present invention. As means of illustration, it is convenient to consider a specific problem. Let is be required that the six-port circuit be used for calibrating balometer mounts and measuring reflection coefficient, where the detectors $P_3$, $P_4$, $P_5$, and $P_6$ are also of the bolometric type, and be inherently lossless and broadband.

Figure 6A:
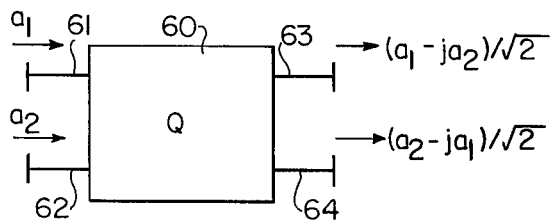
FIGS. 6A and 6B are schematic diagrams of hybrids used in the six-port network of the invention.
Figure 6B:
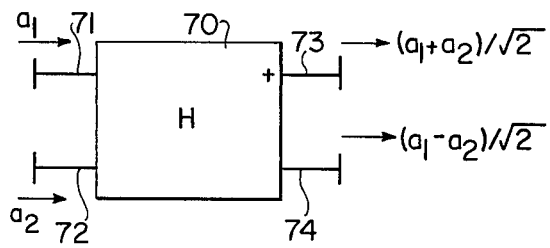

In today's art, the broadest frequency coverage is afforded by stripline components. Here bandwidths of 10:1 are not uncommon. The basic circuits thus available include quadrature hybrids, 180° hybrids, and directional couplers. In waveguide parlance, a quadrature hybrid is a 3dB (four-port) directional coupler, while an 180° hybrid is an E-H tee. These two hybrids and the relationships which exist among the incident and emergent wave amplitudes are as shown in FIGS. 6A and 6B. In FIG. 6A, a quadrature hybrid 60 has two input ports 61 and 62, receiving signals $a_1$ and $a_2$ respectively. Two output ports 63 and 64 provide the respective signals $(a_1 - ja_2)/\sqrt{2}$ and $(a_2 - ja_1)/\sqrt{2}$. In FIG. 6B, a 180° hybrid 70 receives signals $a_1$ and $a_2$ on input ports 71 and 72, while signals $(a_1 + a_2)/\sqrt{2}$ and $(a_1 - a_2)/\sqrt{2}$ appear on output ports 73 and 74. Ideally, these devices are lossless and matched at all ports.

In the existing art, a broadband circuit which yields a 120° phase shift is unknown. However, one is able to achieve a broadband 90° phase shift by means of quadrature hybrid. This suggests some compromises in the design goals outlined above.

Figure 7:
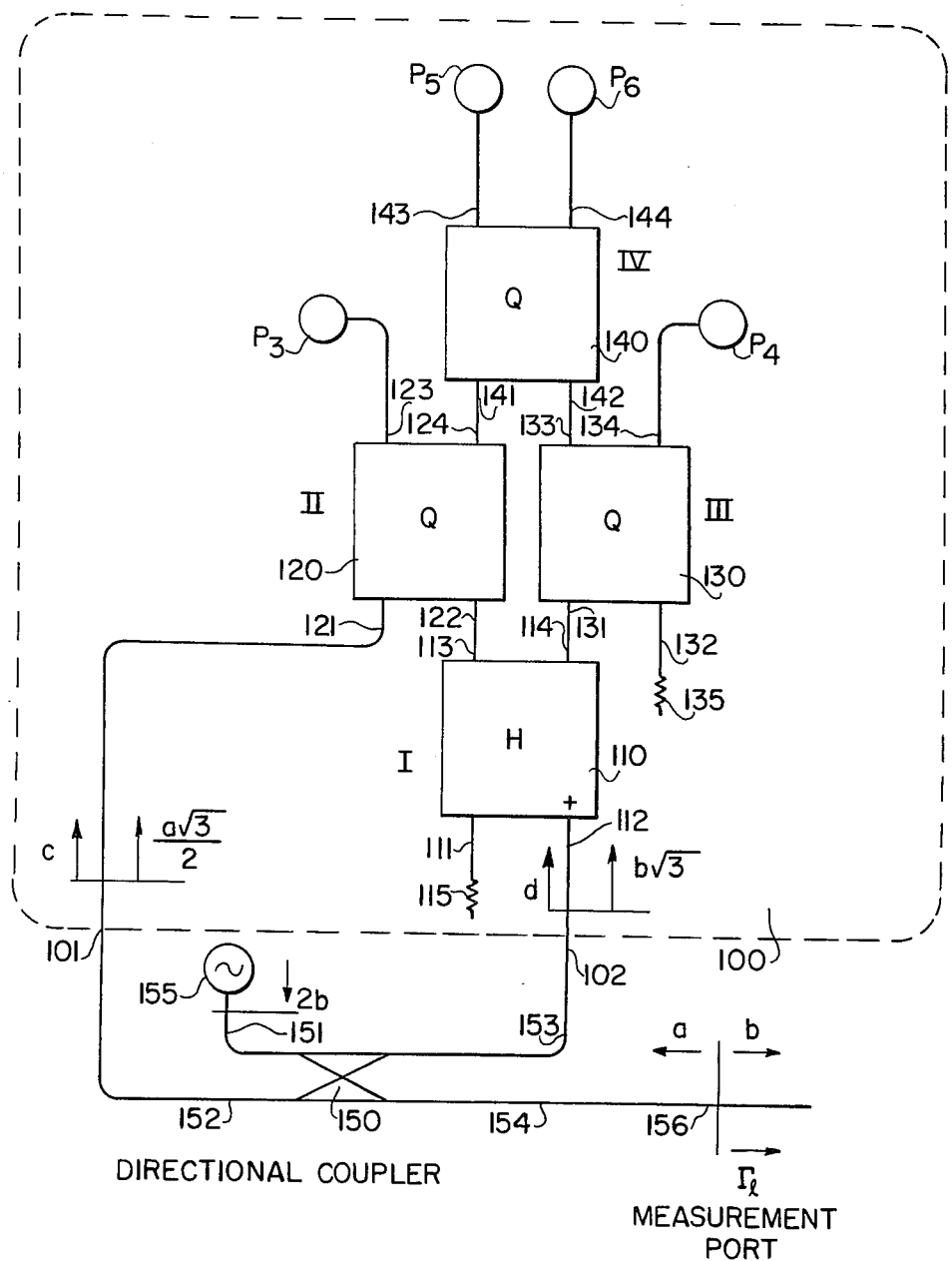
FIG. 7 is a schematic circuit diagram of a first embodiment of the invention.

A preferred embodiment of the six-port measuring circuit of the invention is shown in FIG. 7. The basic six-port 100 has input ports 101 and 102. Four hybrids at positions, I, II, III, and IV are employed. A 180° hybrid 110 at position I has a port 111 terminated by resistive termination 115. A port 112 is connected to input port 102. As described below, ports 113 and 114 of hybrid 110 are connected to ports of hybrids at positions II and III, respectively. A quadrature hybrid 120 is at position II with a port 121 connected to input port 101. A port 122 of hybrid 120 is connected to port 113 of hybrid 110. A port 123 of hybrid 120 serves as a measuring port of six-port 100 and is connected to a power meter $P_3$, and port 124 is connected to the hybrid at position IV. A quadrature hybrid 130 at position III has a port 131 connected to port 114 of hybrid 110, while a port 132 is connected to resistive termination 135. A port 133 of hybrid 130 is connected to the hybrid at position IV. The fourth port 134 of hybrid 130 is a measuring port of the six-port 100 and is connected to power meter $P_4$. At position IV, quadrature hybrid 140 has ports 141 and 142 connected respectively to ports 124 and 133 of hybrids 120 and 130. The remaining two ports 143 and 144 of hybrid 140 serve as measuring ports of six-port 100 and are connected, respectively, to power meters $P_5$ and $P_6$.

Six-port 100 is coupled to a transmission line 156 by means of a four-port directional coupler 150, which in the example being considered is a 6 dB directional coupler. A first port 151 of directional coupler 150 is connected to a signal generator 155. Second and third ports 152 and 153 of the directional coupler are connected, respectively, to input ports 101 and 102 of six-port 100. The fourth port 154 of the directional coupler is connected to transmission line 156 where a terminal plane indicated by the vertical line establishes a measurement port.

In analyzing the operation of the circuit of FIG. 7, ideal components are assumed. Consistent with the notation used in Equations (1), (2), (3), and (4), the emergent and incoming wave amplitudes at the measurement port (terminal plane) are designated by $b$ and $a$, respectively. As indicated on FIG. 7, the wave amplitude at input port 101 of six-port 100 will be $a\sqrt{3}/2$, and the wave amplitude at input port 102 of six-port 100 will be $b\sqrt{3}$. The power responses at the respective power meters will be $$P_3 = \tfrac{3}{8} |b|^2 |\Gamma_l - j\sqrt{2}|^2 \tag{11}$$

$$P_4 = \tfrac{3}{4} |b|^2 \tag{12}$$

$$P_5 = 3/16 |b|^2 |\Gamma_l + (1+j)\sqrt{2}|^2 \tag{13}$$

$$P_6 = 3/16 |b|^2 |\Gamma_l - (1-j)\sqrt{2}|^2 \tag{14}$$

These values are confirmed by comparison with the hybrid characteristics as shown in FIGS. 6A and 6B. Note, however, that no attempt has been made to keep track of the phase of $a$ and $b$ or even their phase differences in an absolute sense. The only question of importance in this context is: How does the phase difference between $a$ and $b$ at the measuring port connected to $P_3$ compare with that which exists at the measuring ports connected to $P_5$ and $P_6$?

The power responses also may be considered in terms of the wave amplitudes at input ports 101 and 102 of six-port 100 itself, which will function as a vector voltmeter. Designating the wave amplitude at input port 101 as $c$ and the wave amplitude at input port 102 as $d$, it follows from FIG. 7 that $$c = a\sqrt{3}/2 \tag{15}$$

$$d = b\sqrt{3} \tag{16}$$

In terms of $c$ and $d$, the responses are $$P_3 = \tfrac{1}{2} |d|^2 |c/d - j\sqrt{2}/2|^2 \tag{17}$$

$$P_4 = \tfrac{1}{4} |d|^2 \tag{18}$$

$$P_5 = \tfrac{1}{4} |d|^2 |c/d + (1+j)\sqrt{2}/2|^2 \tag{19}$$

$$P_6 = \tfrac{1}{4} |d|^2 |c/d - (1-j)\sqrt{2}/2|^2 \tag{20}$$

In a practical application the complex ratio $c/d$ is almost always of interest; the value $|d|^2$ may or may not be of interest. This is the motivation behind expressing the equations in this particular form. Given the observation of $P_3$, $P_4$, $P_5$, and $P_6$ one can solve for both $|d|^2$ and $c/d$. The unique feature of this circuit lies in the terms $-j\sqrt{2}/2$, $(1+j)\sqrt{2}/2$ and $-(1-j)\sqrt{2}/2$ which are added to $c/d$ in these equations. Although there is some interest in vector voltmeter 100 on a "stand alone" basis, more often it is connected to other microwave circuitry. FIG. 7 may be regarded as a typical application. In this application, the ultimate interest is in $|b|^2$ and $a/b$. As already noted, however, in this particular case $c = a\sqrt{3}/2$ and $d = b\sqrt{3}$ so that if $|d|^2$ and $c/d$ are known, this leads easily to $|b|^2$ and $a/b$. In a more general application, there may be a different functional relationship between $c$ and $d$ and the parameters $a$ and $b$; e.g., one may have $$c = Ka + Lb \tag{21}$$

$$d = Ma + Nb \tag{22}$$

where K, L, M, and N are complex constants. Again, however, if K, L, M, and N are known, a measurement of $|d|^2$ and $c/d$ suffices to determine $|b|^2$ and $a/b$.

The measurements made by power meters $P_3$, $P_4$, $P_5$, and $P_6$ of FIG. 7 may be used for computing the net power and the complex reflection coefficient $\Gamma_l$ at the terminal surface (measurement port) to uniform transmission line 156. These parameters may be computed from the equations:

$$\text{Net power} = 4/3 \, [4 P_4 - P_3 - P_5 - P_6] \quad (23)$$

and $$\Gamma_l = \frac{\sqrt{2} \ [(P_5 - P_6) + j(P_5 + P_6 - P_3 - P_4)/2]}{2 P_4}. \quad (24)$$

It is to be noted that other terminal variables such as wave amplitudes, voltage, current, impedance, etc., may be obtained from these computed parameters by the use of well-known formulas. In practice, Equations (23) and (24) are useful when the quadrature and 180° hybrids and the directional coupler, from which the circuit is constructed, closely approximate the ideal. When this is not the case, the circuit continues to be useful, even when constructed of components whose performance differs substantially from the ideal. For this non-ideal case, however, a more general approach to the utilization of the circuit is preferred. The manner in which the more general approach may be applied will be readily apparent to the skilled worker in the art from a number of papers published in the prior art, including the aforementioned publications of G. F. Engen and C. A. Hoer in *IEEE Trans. Instrum. Meas.*, Vol. IM-21, November 1972; C. A. Hoer and G. F. Engen in Proc. IMEKO Symp. Acquisition and Processing of Measurement Data for Automation, June 17-23, 1973; G. F. Engen in *IEEE Trans. Instrum. Meas.*, Vol. IM-22, December 1973; C. A. Hoer in Nat. Bur. Stand. Tech. Note 673, September 1975; and C. A. Hoer and K. C. Roe in *IEEE Trans. Microwave Theory and Techniques*, December 1975, all of which publications are incorporated by reference herein.

Figure 8:
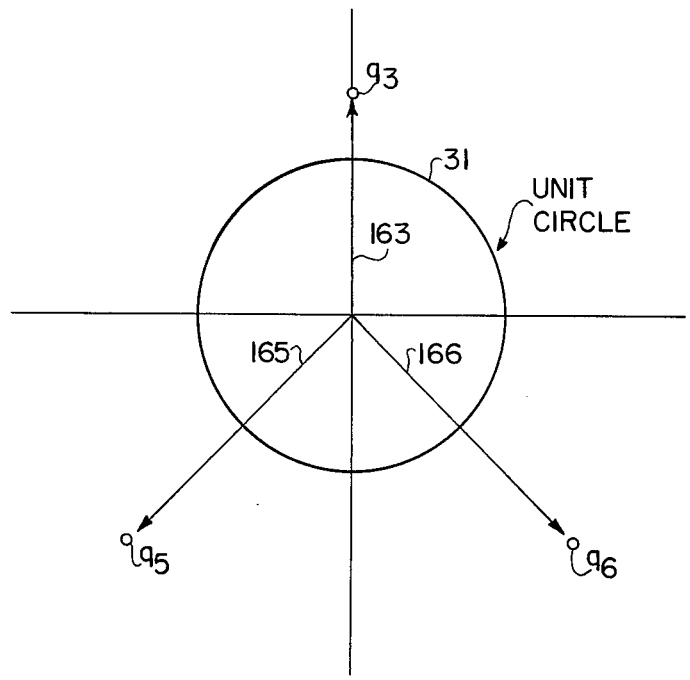
FIG. 8 is a schematic diagram illustrating a property of the embodiment of FIG. 7.

When the circuit of FIG. 7 is compared with the previously discussed design goals, it is first noteworthy that resistive terminations 115 and 135 are used at two different locations. Ideally, however, none of the signal power reaches these terminations, so the circuit is inherently lossless. In addition $C = 0$ for this circuit, thus satisfying the requirements of Equation (5), while the values of $q_3$, $q_5$, $q_6$, except for an unknown phase shift introduced, for example, by a phase difference in lines 101 and 102, are as shown in FIG. 8, where 163, 165, and 166 represent the values of the parameters $q_3$, $q_5$, and $q_6$, respectively. As compared with the 120° design objective, the angle between 165 and 166 is 90°; the angle between 165 and 163 is 135°; and the angle between 163 and 166 is 135°. Whereas the design objective required that $|q_3| = |q_5| = |q_6|$, the circuit of FIG. 7 provides $|q_5| = |q_6|$ and $|q_3| = |q_5|/\sqrt{2}$. Although this result falls somewhat short of the design objectives, the design goals are more nearly achieved by this circuit than by any other which has been devised to date. Moreover, it appears that the theoretical loss in performance between the circuit of FIG. 7 and the design ideal may be small in comparison with the performance degradation which results from the use of non-ideal components.

If one assumes 20 mW. of power at the input 151, 5mW. or ¼ of this reaches the measurement port at 156. If the termination at the measurement port is a matched load, this power will be absorbed, while the remaining ¾ of the power is divided equally among the power detectors $P_3$, $P_4$, $P_5$, and $P_6$, resulting in a power level of 3.75 mW. for each. If now $P_4$ is stabilized at this value, and a sliding short is connected to the measurement port at 156, the value at $P_3$ will reach approximately 11 mW. for certain short positions, while the maximums at $P_5$ and $P_6$ will be approximately 8.5 mW. The maximum dynamic range excursion at any detector is a nominal 15 dB which occurs at $P_3$.

The circuit of FIG. 7 thus provides a reasonably optimal set of values for $|A|$, $|D|$, $|E|$, and $|G|$, which in turn determine the distribution of the available signal power among the several detectors and the measurement port.

Perhaps the most distinctive feature of the circuit of FIG. 7 is in the ratios $q_5/q_3$ and $q_6/q_3$ which it yields. Apart from a constant multiplier, the "$q$" values are determined entirely by the basic six-port 100. Taken alone, basic six-port 100 may be considered as "vector voltmeter" which, more generally, has been the subject of the earlier paper of C. A. Hoer and K. C. Roe in *IEEE Trans. Microwave Theory & Technique*, Vol. MTT-23, No. 12, December 1975. As a vector voltmeter, circuit 100 has certain advantages for some applications. In particular, if it is stipulated that one of the four outputs be proportional to one of the input signals, this circuit requires fewer components. Moreover, as previously noted, the circuit is inherently lossless, and thus makes more efficient use of the power input. Finally, the "$q$" spacing is 90°, 135°, 135°, rather than 90°, 90°, 180°, as is usually the case in circuits of the prior art.

In addition to the ratios between the $q$'s, the ratios among $|A|$, $|D|$, $|E|$, and $|G|$ are also determined by the vector voltmeter portion 100 of the circuit. By contrast, and except as subsequently noted, the absolute magnitudes of all of these terms are determined by that portion of the circuit external to vector voltmeter 100.

Returning again to FIG. 7, one notes that the input levels to vector voltmeter 100 are $b\sqrt{3}$ and $a\sqrt{3}/2$. Basically, the parameters at one's disposal in adjusting the magnitudes of $q$ or A, D, E, and G are the coefficients of $b$ and $a$. Let these be designated by $\beta$ and $\alpha$ so that in FIG. 7, $\beta = \sqrt{3}$ and $\alpha = \sqrt{3}/2$. It is possible to adjust $\alpha$ and $\beta$ by a variety of methods, but first it should be noted that the $|q|$'s are proportional to $\beta/\alpha$ while $|A|$, $|D|$, $|E|$, and $|G|$ are proportional to $\beta$. In principle, $\alpha$ and/or $\beta$ can be made small by the use of attenuation in the respective lines. (This attenuation could also be placed at various positions inside vector voltmeter 100). Moreover, $\beta$ can be made arbitrarily large by changing 6 dB coupler 150 to 10 dB, 20dB, etc. At the same time, $\alpha$ also increases but, in contrast to $\beta$, approaches unity as a limit. Moreover, it is not hard to recognize that this must also be the limit for any passive circuit. This limit on $\alpha$ indirectly imposes an upper limit of perhaps 2 or so on $\beta$, since otherwise the $|q|$ terms would become larger than desired. This, in turn, leads to an upper limit on $|A|$, $|D|$, $|E|$, and $|G|$ and thus on the signals at the power detectors.

If one removes the lossless restriction, and assumes a surplus of input power, one could, as already noted, realize a small increase in $\alpha$ by going to a 10- or 20-dB coupler. The resulting increase in $\beta$, however, would need to be offset by an attenuator in the line which feeds 180° hybrid 110. As an alternative to this attenuation, one might insert another directional coupler or power divider at this point and use some of the surplus signal to obtain a substantially larger value for $P_4$. In either case, however, the increase in $P_3$, $P_5$, and $P_6$ would only be a nominal 5% or 10%, which makes this modification of doubtful practical interest.

If, in addition to assuming a surplus of signal input power, one removes the restriction on the signal level at the measurement port, or assumes that it is substantially larger than that required at $P_3$, $P_4$, $P_5$, and $P_6$, this eliminates the requirement to make $\alpha$ as large as possible. Ordinarily, in this mode, the connections at the left side of the coupler should be reversed, and the desired signal levels and values of $|q|$ realized through the choice of coupling values and possibly attenuators.

In addition to obtaining a numerical output, to which the various corrections have been applied, it is frequently useful to have a real time oscilloscope display of the results, even at a substantially reduced accuracy. For the ideal circuit of FIG. 7, one has $$\frac{P_5 - P_6}{P_4} = \sqrt{2} \; Re \, (\Gamma_l), \tag{25}$$

while $$\frac{P_5 + P_6 - P_3 - P_4}{2P_4} = \sqrt{2} \; Im \, (\Gamma_l), \tag{26}$$

where Re $(\Gamma_l)$ and Im $(\Gamma_l)$ represent the real and imaginery parts of the reflection coefficient $\Gamma_l$. Thus, if $P_3$, $P_4$, $P_5$, and $P_6$ are available in analogue form, and assuming the system is leveled so that $P_4$ is constant, one can obtain signals proportional to the real and imaginary parts of $\Gamma_l$ by simple addition. These signals may then be applied to an oscilloscope to provide a visual display of the reflection coefficient.

As a variant to FIG. 7, one may replace 6-dB directional coupler 150 with a 3-dB directional coupler. If this is done, the power level at the measurement port is doubled, but at the expense of the power levels at $P_3$, $P_4$, $P_5$, and $P_6$. In addition the $|q|$ terms are multiplied by $\sqrt{2}/2$, so that $|q_3| = 1$. Fortunately, in this case the ill conditioning associated with the calibration procedure can be avoided since $|q_5| = |q_6| = \sqrt{2}$. Because 3-dB directional couplers are more readily available than 6-dB directional couplers, this alternative may often be preferred.

Figure 9:
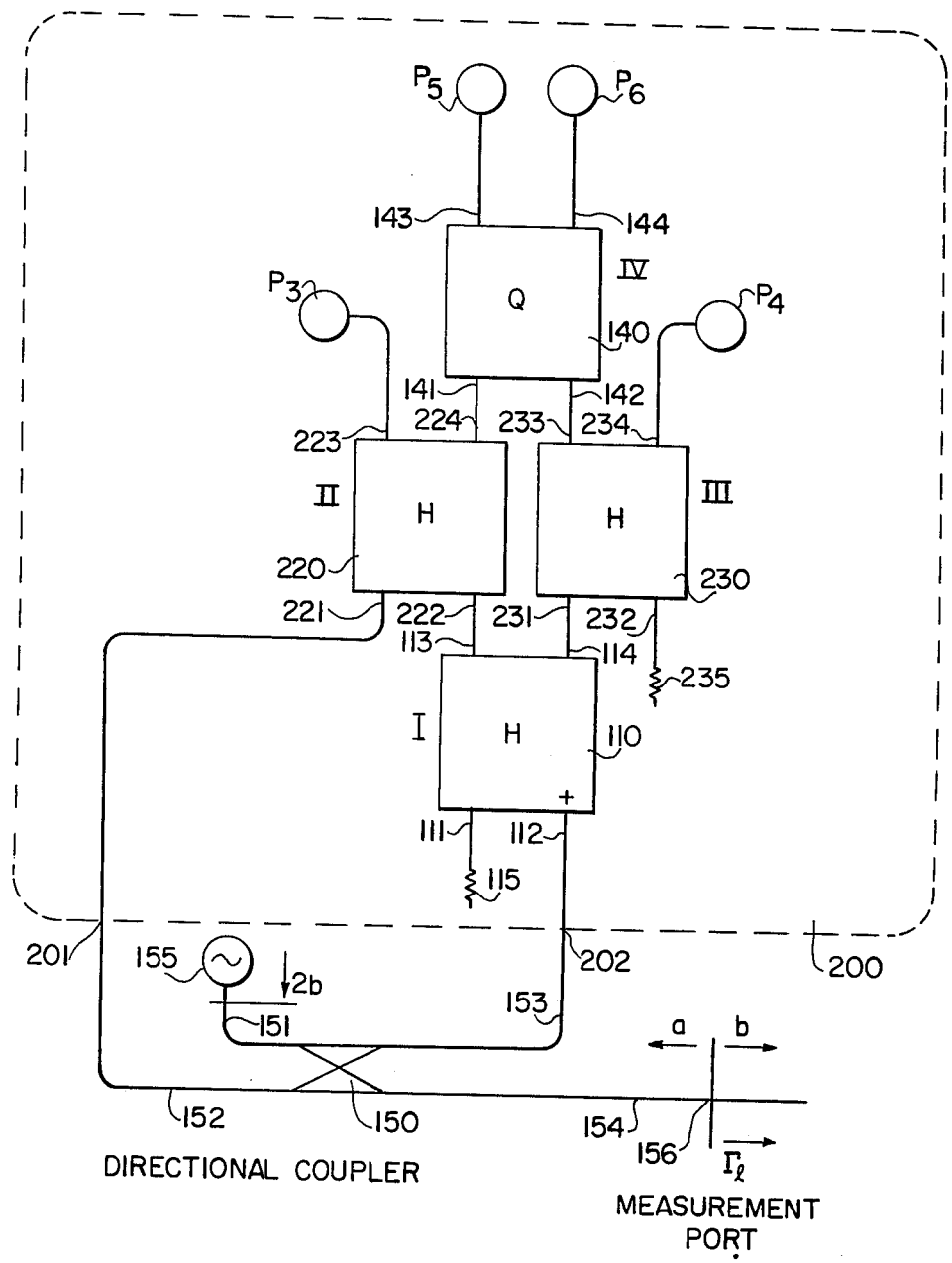
FIG. 9 is a schematic circuit diagram of a second embodiment of the invention.

A number of other variants and embodiments of vector voltmeter six-port 100 may be adopted. As shown in FIG. 9, the hybrids at positions II and III may be changed from quadrature to 180° hybrids 220 and 230, respectively. The connections to these hybrids are identical to those made to the hybrids at the same positions in FIG. 7. Thus, input port 201 of six-port 200 is connected to a port 221 of hybrid 220, and input port 202 of six-port 200 is connected to port 112 of 180° hybrid 110. Port 113 of hybrid 110 is connected to port 222 of hybrid 220, while port 114 of hybrid 110 is connected to port 231 of hybrid 230. Measuring port 223 of hybrid 220 is connected to power meter $P_3$, and port 224 of hybrid 220 is connected to port 141 of quadrature hybrid 140. As for hybrid 230, port 232 is connected to termination 235; port 233 is connected to port 142 of quadrature hybrid 140; and measuring port 234 is connected to power meter $P_4$. The connections of the embodiment of FIG. 9 are otherwise identical to those of FIG. 7 as indicated by the use of like reference numerals.

Figure 10:
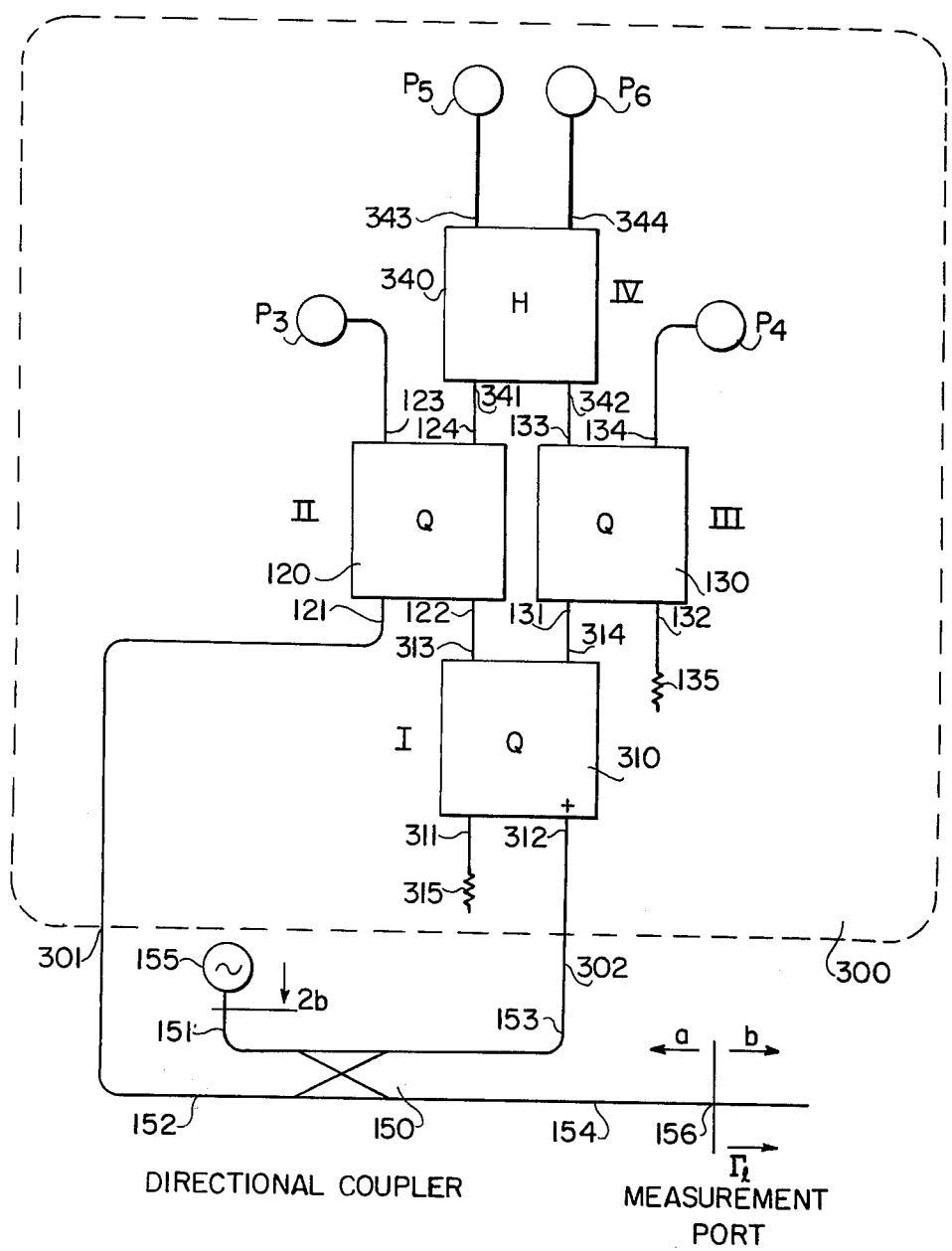
FIG. 10 is a schematic circuit diagram of a third embodiment of the invention.

As shown in FIG. 10, the quadrature and 180° hybrids at positions I and IV of FIG. 7 may also be interchanged. The resulting vector voltmeter six-port 300 has quadrature hybrid 310 at position I and 180° hybrid 340 at position IV. Input ports 301 and 302 of a six-port 300 are connected, respectively, to port 121 of quadrature hybrid 120 and port 312 of quadrture hybrid 310. Port 311 of hybrid 310 is connected to termination 315; port 313 is connected to port 122 of quadrature hybrid 120; and port 314 of hybrid 310 is connected to port 131 of quadrature hybrid 130. Turning to 180° hybrid 340, measuring ports 343 and 344 are connected respectively to power meters $P_5$ and $P_6$. Port 341 is connected to port 124 of quadrature hybrid 120, and port 342 is connected to port 133 of hybrid 130. The connections are otherwise the same as in FIG. 7 as indicated by the use of like reference numerals.

Figure 11:
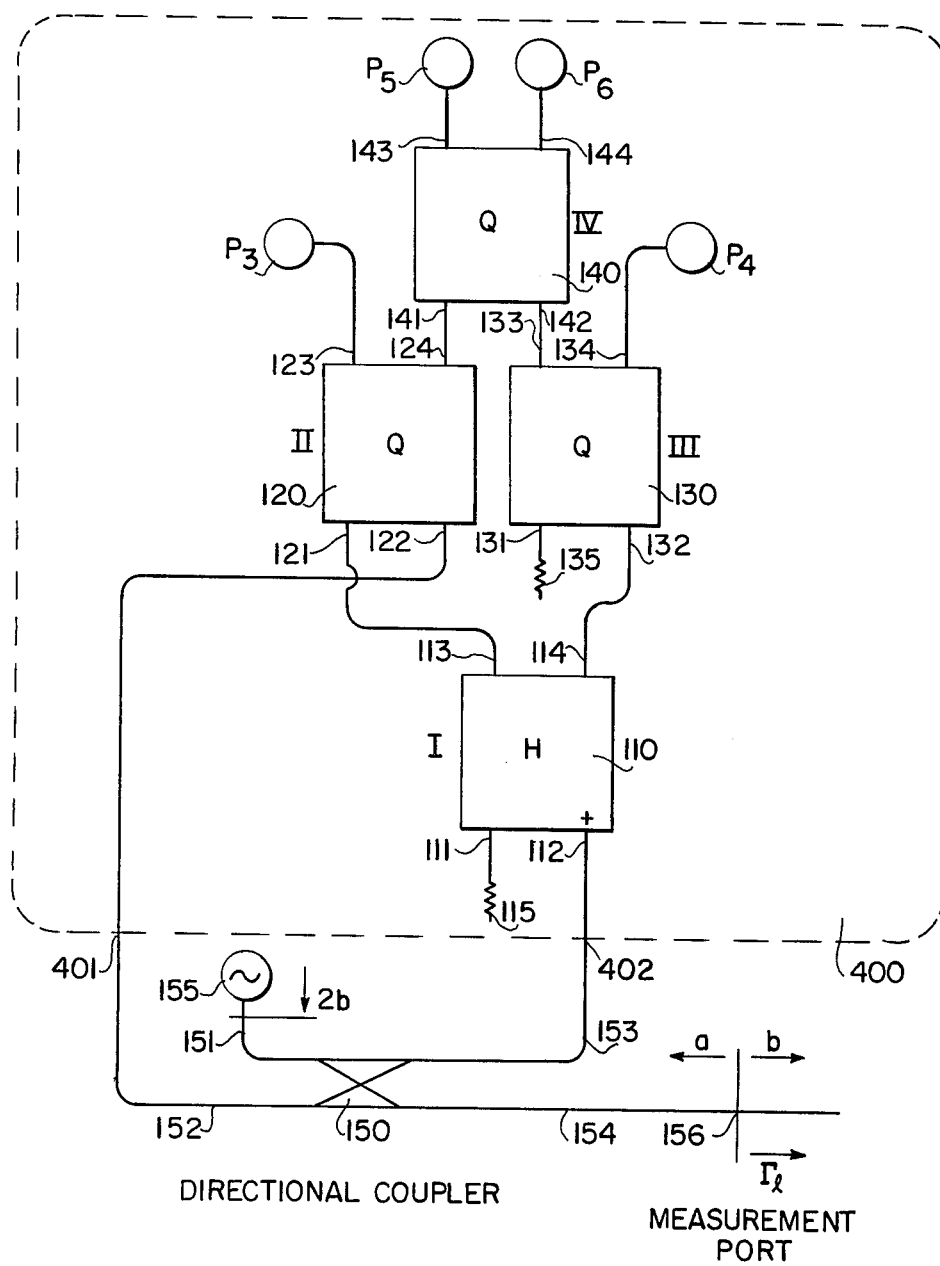
FIG. 11 is a schematic circuit diagram of a variant of the embodiment of FIG. 7.

A variant of FIG. 7 is shown in FIG. 11. Here, the connections at the inputs of the hybrids 120 and 130 at positions II and III are interchanged as compared to the connections used in the embodiment of FIG. 7. Thus, six-port 400 has an input port 401 connected to port 122 of quadrature hybrid 120 and an input port 402 connected to port 112 of 180° hybrid 110. Port 113 of hybrid 110 is connected to port 121 of hybrid 120, and port 114 of hybrid 110 is connected to port 132 of quadrature hybrid 130. The termination 135 for hybrid 130 is connected to port 131. The remaining connections are the same as those shown in FIG. 7.

Figure 12:
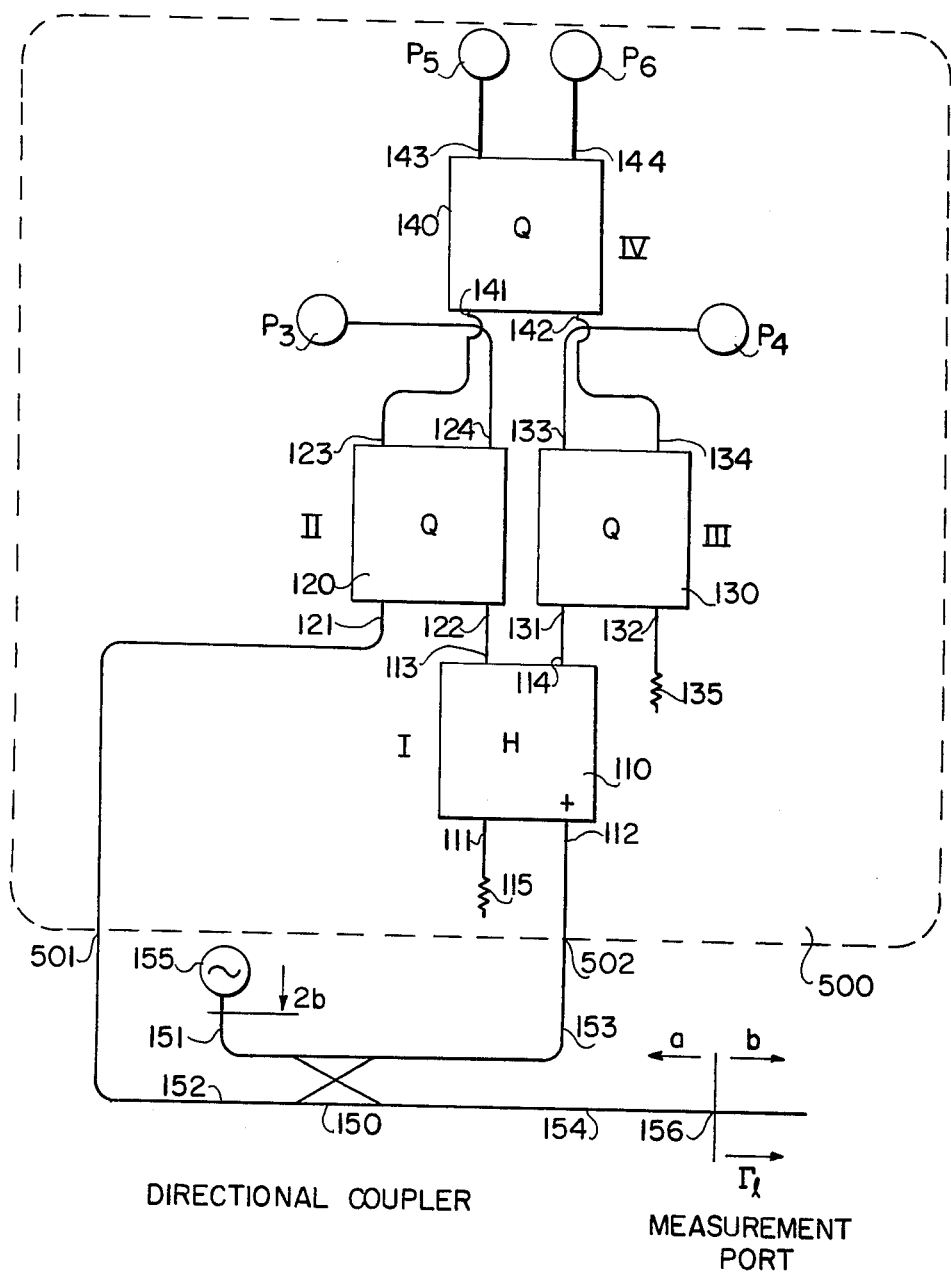
FIG. 12 is a schematic circuit diagram of a second variant of the embodiment of FIG. 7.

Similarly, in the embodiment shown at 500 in FIG. 12, the output connections from quadrature hybrids 120 and 130 at positions II and III are interchanged from those used in FIG. 7. Power meters $P_3$ and $P_4$ are connected, respectively, to port 124 of hybrid 120 and port 133 of hybrid 130. Ports 141 and 142 of hybrid 140 are connected, respectively, to ports 123 of hybrid 120 and port 134 of hybrid 130. The connections are otherwise the same as in the circuit of FIG. 7. Thus, input port 501 of six-port 500 is connected to port 121 of hybrid 120, while input port 502 is connected to port 112 of hybrid 110.

Figure 13:
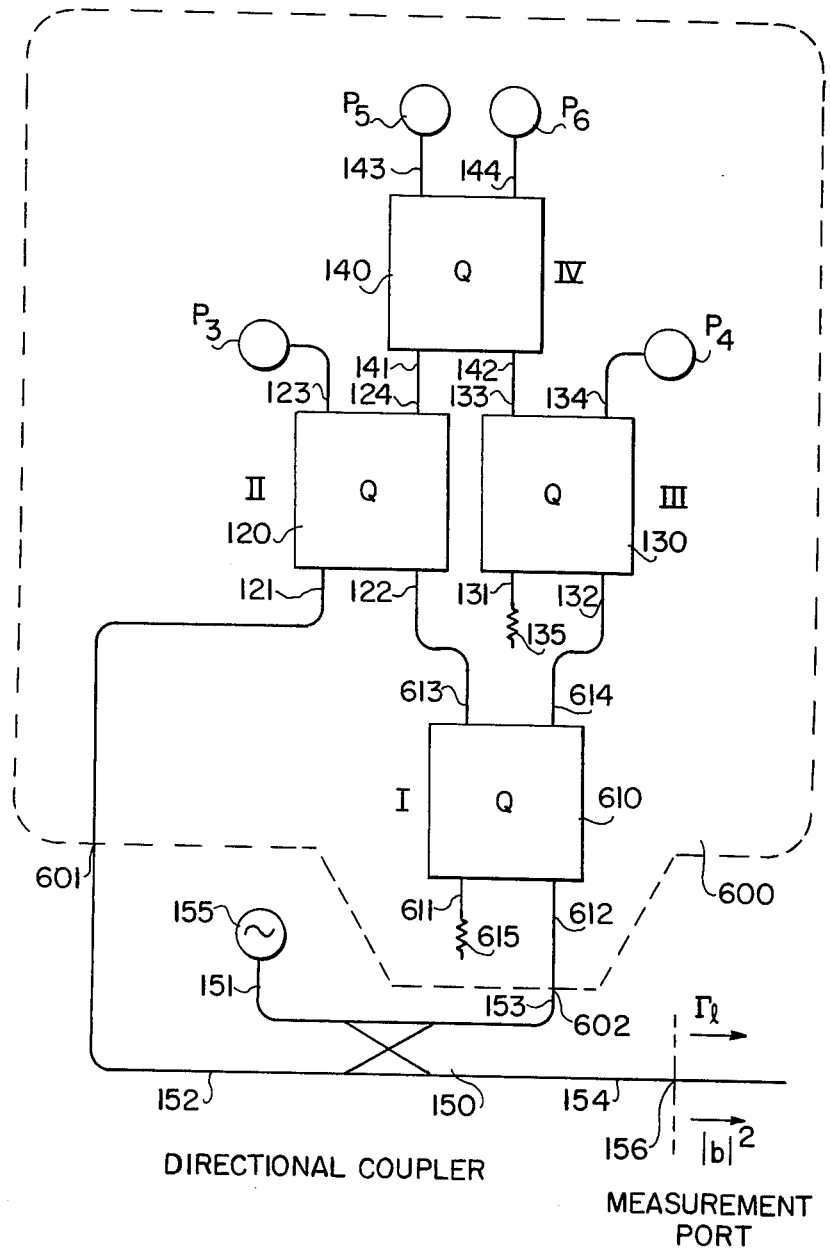
FIG. 13 is a schematic circuit diagram of a fourth embodiment of the invention.

Another embodiment is shown at 600 in FIG. 13. Here, all hybrids are of the quadrature type. Thus, a quadrature hybrid 610 is substituted at position I for the 180° hybrid 110 of FIG. 7. The four ports 611, 612, 613, and 614 of hybrid 610 are connected, respectively, to termination 615, input port 602 of six-port 600, port 122 of hybrid 120, and port 132 of hybrid 130. Port 131 of hybrid 130 is connected to termination 135. The other input port 601 of six-port 600 is connected to port 121 of hybrid 120. The connections are otherwise the same as in FIG. 7.

Figure 14:
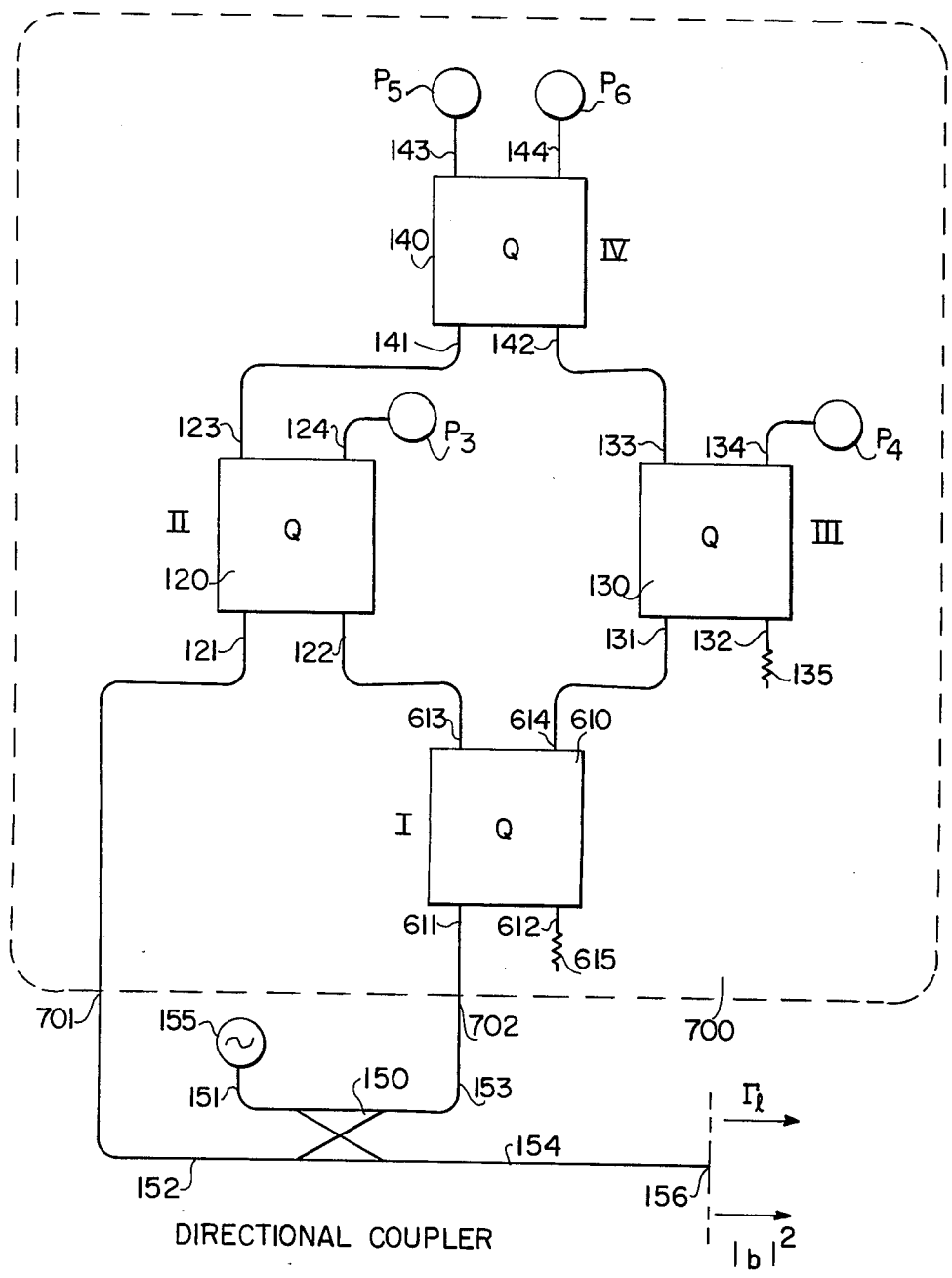
FIG. 14 is a schematic circuit diagram of a variant of the embodiment of FIG. 13.

A variant of the embodiment of FIG. 13 is shown at 700 in FIG. 14. The same components are used as in FIG. 13, as indicated by the use of like reference numerals, but with different interconnections between hybrid ports and terminations as shown. Input port 702 of six-port 700 is connected to port 611 of hybrid 610, while port 612 of this hybrid is connected to termination 615. Input port 701 of six-port 700 is connected to port 121 of hybrid 120. Port 614 of hybrid 610 is connected to port 131 of hybrid 130, the port 132 of which is connected to termination 135. Power meter $P_3$ is connected to port 124 of hybrid 120, while port 123 of hybrid 120 is connected to port 141 of hybrid 140. The connections are otherwise the same as those used in FIG. 13.

In another variant of the circuit of FIG. 7, the input connections to hybrid 110 at position I are interchanged. Thus, input port 102 of the six-port is connected to port 111 of hybrid 110, while termination 115 is connected to port 112 of hybrid 110.

As compared with the six-port circuits of the prior art, each of the embodiments and variants of the six-port measuring circuit of the present invention requires fewer components and is inherently lossless. This, in turn, reduces the power input requirements. Moreover, the "$q$" values provided more nearly approach the design ideal.

While particular embodiments of the invention have been shown and described, it will be readily apparent to those skilled in the art that changes and modifications may be made without departing from the spirit and principles of the invention the scope of which is defined in the appended claims.

The invention claimed is:

1. A measuring circuit comprising: a six-port network having first and second input ports and third, fourth, fifth, and sixth measuring ports, the power response at each of said measuring ports being defined substantially by:

$$P_3 = \tfrac{1}{4}|d|^2 |c/d - j\sqrt{2}/2|^2$$

$$P_4 = \tfrac{1}{4}|d|^2$$

$$P_5 = \tfrac{1}{4}|d|^2 |c/d + (1+j)\sqrt{2}/2|^2$$

$$P_6 = \tfrac{1}{4}|d|^2 |c/d - (1-j)\sqrt{2}/2|^2$$

where $c$ represents the wave amplitude at said second input port, $d$ represents the wave amplitude at said first input port, $P_3$ represents the power response at said third measuring port, $P_4$ represents the power response at said fourth measuring port, $P_5$ represents the power response at said fifth measuring port, and $P_6$ represents the power response at said sixth measuring port;

said six-port network comprising first, second, third, and fourth hybrid means, wherein said first input port is coupled to a first port of said first hybrid means, said second input port is coupled to a first port of said second hybrid means, a second port of said first hybrid means is coupled to a second port of said second hybrid means, a third port of said first hybrid means is coupled to a first port of said third hybrid means, a third port of said second hybrid means is coupled to a first port of said fourth hybrid means, a second port of said third hybrid means is coupled to a second port of said fourth hybrid means, said third measurement port is coupled to a fourth port of said second hybrid means, said fourth measurement port is coupled to a third port of said third hybrid means, said fifth measurement port is coupled to a third port of said fourth hybrid means, and said sixth measurement port is coupled to a fourth port of said hybrid means.

2. A measuring circuit as recited in claim 1, wherein said measuring circuit is a vector voltmeter.

3. A measuring circuit as recited in claim 1, wherein said input ports are coupled to a directional coupler having a measurement port at which the emergent and incoming wave amplitudes are designated by $b$ and $a$, respectively, and wherein $$c = Ka + Lb$$

$$d = Ma + Nb$$

where K, L, M, and N are complex constants.

4. A measuring circuit as recited in claim 1, wherein said input ports are coupled to a 6 dB. directional coupler having a measurement port at which the emergent and incoming wave amplitudes are designated by $b$ and $a$, respectively, and wherein $$c = a\sqrt{3}/2$$

$$d = b\sqrt{3}.$$

5. a measuring circuit as recited in claim 4, wherein said power responses are defined by:

$$P_3 = \tfrac{3}{4}|b|^2 |\Gamma_l - j\sqrt{2}|^2$$

$$P_4 = \tfrac{3}{4}|b|^2$$

$$P_5 = 3/16 |b|^2|\Gamma_l + (1+j)\sqrt{2}|^2$$

$$P_6 = 3/16 |b|^2|\Gamma_l - (1-j)\sqrt{2}|^2$$

where $\Gamma_l$ is the complex reflection ratio beteen the amplitudes of the incoming wave $a$ and the emerging wave $b$.

6. A measuring circuit as recited in claim 1, wherein said first hybrid means is a 180° hybrid and said second, third, and fourth hybrid means are quadrature hybrids.

7. A measuring circuit as recited in claim 1, wherein said first, second, and third hybrid means are 180° hybrids and said fourth hybrid means is a quadrature hybrid.

8. A measuring circuit as recited in claim 1, wherein said first, second, and third hybrid means are quadrature hybrids and said fourth hybrid means is a 180° hybrid.

9. A measuring circuit as recited in claim 1, wherein said first, secnd, third, and fourth hybrid means are quadrature hybrids.

10. A six-port measuring network comprising: first and second input ports; third, fourth, fifth, and sixth measuring ports; first, second, third, and fourth hybrid means; and means so interconnecting said ports and said hybrid means that said first input port is coupled to a first port of said first hybrid means, said second input port is coupled to a first port of said second hybrid means, a second port of said first hybrid means is coupled to a second port of said second hybrid means, a third port of said first hybrid means is coupled to a first port of said third hybrid means, a third port of said second hybrid means is coupled to a first port of said fourth hybrid means, a second port of said third hybrid means is coupled to a second port of said fourth hybrid means, said third measurement port is coupled to a fourth port of said second hybrid means, said fourth measurement port is coupled to a third port of said third hybrid means, said fifth measurement port is coupled to a third port of said fourth hybrid means, and said sixth measurement port is coupled to a fourth port of said fourth hybrid means.

11. A six-port measuring network as recited in claim 10, wherein said first hybrid means is a 180° hybrid and said second, third, and fourth hybrid means are quadrature hybrids.

12. A six-port measuring network as recited in claim 10, wherein said first, second, and third hybrid means are 180° hybrids and said fourth hybrid means is a quadrature hybrid.

13. A six-port measuring network as recited in claim 10, wherein said first, second, and third hybrid means are quadrature hybrids and said fourth hybrid means is a 180° hybrid.

14. A six-port measuring network as recited in claim 10, wherein said first, second, third, and fourth hybrid means are quadrature hybrids.

15. A six-port measuring network as recited in claim 10, further comprising directional coupler means coupling said first and second input ports to a signal source and a transmission line measurement port.

16. A six-port measuring network as recited in claim 15, wherein said directional coupler means has first and second ports at one end and third and fourth ports at the other end, and wherein said signal source is connected to said first directional coupler port, said second input port is connected to said second directional coupler port, said first input port is connected to said third directional coupler port, and said transmission line measurement port is connected to said fourth directional coupler port.

17. A six-port measuring network comprising:
first, second, third, and fourth hybrid means;
an input port connected to said first hybrid means;
a second input port connected to said second hybrid means;
a first measuring port connected to said second hybrid means;
a second measuring port connected to said third hybrid means; and
third and fourth measuring ports connected to separate terminals of said fourth hybrid means.

18. A measuring circuit comprising:
a six-port network having first and second input ports and third, fourth, fifth, and sixth measuring ports; and
means coupling said first and second port to a transmission line at a measurement port at which the emergent and incoming waves are designated by $b$ and $a$, respectively;
the power responses $P_3$, $P_4$, $P_5$, and $P_6$ at said third, fourth, fifth, and sixth measuring ports, respectively, being defined substantially by:

$$P_3 = |Aa + Bb|^2$$
$$P_4 = |D|^2 |b|^2$$
$$P_5 = |Ea + Fb|^2$$
$$P_6 = |Ga + Hb|^2$$

where A, B, D, E, F, G, and H are complex constants, and wherein $q_3 = -B/A$, $q_5 = -F/E$, and $q_6 = -H/G$, with $q_3$ angularly spaced from $q_5$ by 135° and from $q_6$ by 135° and $q_5$ angularly spaced from $q_6$ by 90°;
said six-port network comprising first, second, third, and fourth hybrid means, wherein said first input port is coupled to a first port of said first hybrid means, said second input port is coupled to a first port of said second hybrid means, a second port of said first hybrid means is coupled to a second port of said second hybrid means, a third port of said first hybrid means is coupled to a first port of said third hybrid means, a third port of said second hybrid means is coupled to a first port of said fourth hybrid means, a second port of said third hybrid means is coupled to a second port of said fourth hybrid means, said third measurement port is coupled to a fourth port of said second hybrid means, said fourth measurement port is coupled to a third port of said third hybrid means, said fifth measurement port is coupled to a third port of said fourth hybrid means, and said sixth measurement port is coupled to a fourth port of said fourth hybrid means.

19. A measuring circuit as recited in claim 18, wherein $|q_3| = |q_5|/\sqrt{2}$ and $|q_5| = |q_6|$.

20. A measuring circuit comprising:
a six-port network having first and second input ports and third, fourth, fifth, and sixth measuring ports; and
means coupling said first and second port to a transmission line at a measurement port at which the emergent and incoming waves are designated by $b$ and $a$, respectively;
the power responses $P_3$, $P_4$, $P_5$, and $P_6$ at said third, fourth, fifth, and sixth measuring ports, respectively, being defined substantially by:

$$P_3 = |A|^2 |b|^2 |\Gamma_l - q_3|^2$$
$$P_4 = |D|^2 |b|^2$$
$$P_5 = |E|^2 |b|^2 |\Gamma_l - q_5|^2$$
$$P_6 = |G|^2 |b|^2 |\Gamma_l - q_6|^2$$

where $q_3 = -B/A$, $q_5 = -F/E$, and $q_6 = -H/G$, $\Gamma_l$ is the complex reflection ratio between the amplitudes of the incoming wave $a$ and the emerging wave $b$, and A, B, C, E, F, G, and H are complex constants, and wherein $q_3$ is angularly spaced from $q_5$ by 135° and from $q_6$ by 135° and $q_5$ is angularly spaced from $q_6$ by 90°;
said six-port network comprising first, second, third, and fourth hybrid means, wherein said first input port is coupled to a first port of said first hybrid means, said second input port is coupled to a first port of said second hybrid means, a second port of said first hybrid means is coupled to a second port of said second hybrid means, a third port of said first hybrid means is coupled to a first port of said third hybrid means, a third port of said second hybrid means is coupled to a first port of said fourth hybrid means, a second port of said third hybrid means is coupled to a second port of said fourth hybrid means, said third measurement port is coupled to a fourth port of said second hybrid means, said fourth measurement port is coupled to a third port of said third hybrid means, said fifth measurement port is coupled to a third port of said fourth hybrid means, and said sixth measurement port is coupled to a fourth port of said fourth hybrid means.

21. A measuring circuit as recited in claim 20, wherein $|q_5| = |q_6|$ and $|q_3| = |q_5|/\sqrt{2}$.

* * * * *